(12) United States Patent
Dietrich et al.

(10) Patent No.: US 6,335,562 B1
(45) Date of Patent: Jan. 1, 2002

(54) METHOD AND DESIGN FOR THE SUPPRESSION OF SINGLE EVENT UPSET FAILURES IN DIGITAL CIRCUITS MADE FROM GAAS AND RELATED COMPOUNDS

(75) Inventors: Harry B. Dietrich, Fairfax, VA (US); Jin U. Kang, Ellicott City, MD (US); Bela Molnar, Alexandria, VA (US); Michael Y. Frankel, Crofton, MD (US)

(73) Assignee: The United States of America as represented by the Secretary of the Navy, Washington, DC (US)

(*) Notice: Subject to any disclaimer, the term of this patent is extended or adjusted under 35 U.S.C. 154(b) by 0 days.

(21) Appl. No.: 09/457,521

(22) Filed: Dec. 9, 1999

(51) Int. Cl.$^7$ ............................................. H01L 23/58
(52) U.S. Cl. ........................................ 257/631; 438/958
(58) Field of Search ............................ 257/631; 438/958

(56) References Cited

U.S. PATENT DOCUMENTS

| | | | |
|---|---|---|---|
| 3,622,382 A | 11/1971 | Brack et al. ............... | 428/448 |
| 3,914,784 A * | 10/1975 | Hunsperger et al. ........ | 257/280 |
| 3,945,110 A | 3/1976 | Hunsperger et al. ........... | 438/69 |
| 4,017,887 A | 4/1977 | Davies et al. ............... | 257/609 |
| 4,055,815 A | 10/1977 | Smith et al. .................. | 372/10 |
| 4,469,528 A * | 9/1984 | Berth ........................ | 438/403 |
| 4,545,824 A | 10/1985 | Salvi et al. ................. | 438/535 |
| 5,051,804 A | 9/1991 | Morse et al. ............... | 257/463 |
| 5,154,023 A * | 10/1992 | Sioshansi ..................... | 451/41 |
| 5,183,767 A | 2/1993 | Baratte et al. ............. | 438/474 |
| 5,508,829 A | 4/1996 | Freeouf et al. ............... | 359/3 |
| 5,648,666 A | 7/1997 | Tran et al. .................. | 257/197 |
| 5,751,159 A | 5/1998 | Holm et al. ................ | 324/767 |
| 6,177,343 B1 * | 1/2001 | Watanabe et al. .......... | 438/639 |

FOREIGN PATENT DOCUMENTS

JP 09260621 A * 10/1997

OTHER PUBLICATIONS

Kang et al., *Appl. Phys. Lett.* 70 (12), Mar. 24, 1997, pp 1560–1562.

* cited by examiner

*Primary Examiner*—Nathan Flynn
*Assistant Examiner*—Scott R. Wilson
(74) *Attorney, Agent, or Firm*—John J. Karasek; Amy L. Ressing

(57) ABSTRACT

Single event upset failure are suppressed in GaAs-based electronics by implanting the GaAs substrate with an appropriate dose of O and at least one of either Al, Cr, or In.

6 Claims, 2 Drawing Sheets

METHOD AND DESIGN FOR THE SUPPRESSION OF SINGLE EVENT UPSET FAILURES IN DIGITAL CIRCUITS MADE FROM GAAS AND RELATED COMPOUNDS

BACKGROUND OF THE INVENTION

1. Field of the Invention

The present invention relates generally to digital circuits and more specifically to digital circuits made from GaAs and related compounds.

2. Description of the Background Art

Like all electronic devices, digital circuits execute the functions for which they are designed, through the careful control of charge flow within the circuit. The introduction of stray charge through leakage, temperature excursions or ionizing radiation can cause any electronic circuit to malfunction. Digital circuits, because of the low-voltages and currents inherent in the devices from which they are constructed, are extremely susceptible to stray charge.

Digital circuits, in particular high-speed digital circuits, are subject to a particular kind of stray charge associated fault, termed: A single-event upset (SEU). This fault occurs when a high-energy charged particle enters the substrate beneath the active layer in which the devices have been fabricated, and generates a large number of free electrons and holes which can subsequently flow to the biased nodes of the circuit as stray charge. The end result of this event is a loss of information stored in the digital memory or a malfunction in the execution of an instruction taking place in the digital processor at the time of the event.

Digital circuits which are placed in space, near a radioactive source or close to a nuclear explosion are particularly vulnerable to this SEU problem because these environments harbor a large flux of high-energy, charged particles. Current approaches to this single event upset problem are costly and inelegant to the point of being impractical or flawed in some regard such as incompatibility with established manufacturing processes. An example of the former is triple redundancy of the critical digital circuits. This is expensive not only from the point of view of the procurement of the hardware, but from the point of view of the complexity it introduces into the system and for space based systems in added weight, and complexity, both of which are highly undesirable. An example of the latter is the emerging use of an epitaxial layer of what is termed, Low-Temperature GaAs (LTGaAs), between the bulk wafer and the active layer that contains the circuits. This approach works with varying degrees of success, but has some degree of incompatibility with all current manufacturing approaches and is for all intents and purposes totally incompatible with one of the most frequently used approaches.

It should also be pointed out that the insertion of an LTGaAs layer between the active layer and the substrate wafer suppresses another deleterious source of stray current. This is what is termed subthreshold leakage. This is an unwanted current which flows in the digital circuits through a shunting path in the substrate, even when the individual devices are turned off.

The LTGaAs approach, relies on the picosecond lifetimes in the LTGaAs layer to solve the SEU problem. Charge generated in the bulk by the ionizing event, enters the LTGaAs where it is quickly annihilated through recombination; or prompt trapping, with the subsequent release of the stored charge on a time scale that does not impede the operation of the device. The use of LtGaAs, however, reduces the processability of a workpiece.

Kang et al (*Appl. Phys. Lett.*, Vol 70, No 12, pp. 1560–1562) demonstrated that doping of GaAs with oxygen and aluminum can produce picosecond lifetimes. However, these workers used epitaxial layers grown by metal-organic chemical vapor deposition. The doping of layers during epitaxial growth inherently alters the surface of the doped layer, and can alter the processability of the doped workpiece.

SUMMARY OF THE INVENTION

Accordingly, it is an object of this invention to suppress single event upset in devices made using III–V substrates.

It is another object of this invention to suppress single event upset in devices made using III–V substrates without requiring the use of LTGaAs.

It is a further object of the present invention to suppress single event upset in devices made using III–V substrates while maintaining the processability of the workpiece.

BRIEF DESCRIPTION OF THE DRAWINGS

A more complete appreciation of the invention will be readily obtained by reference to the following Description of the Preferred Embodiments and the accompanying drawings, wherein.

Figure 1A:
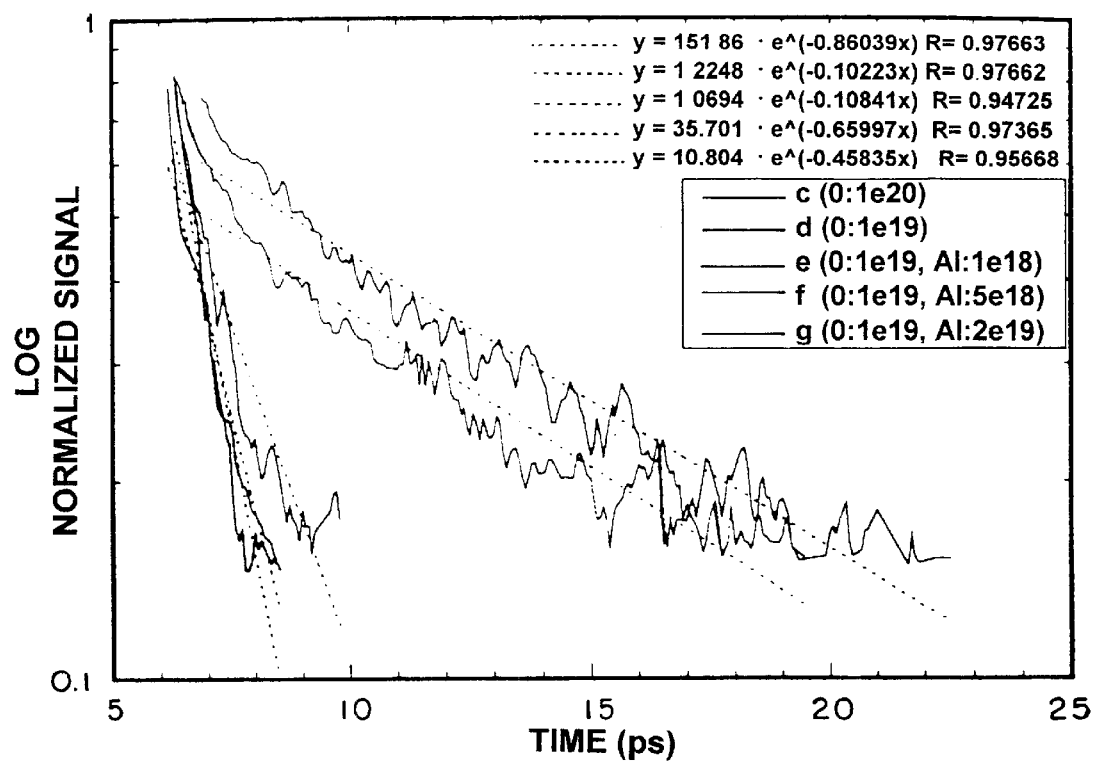
FIG. 1a is a graph showing free carrier lifetime, as a function of various implant conditions, with the dosage units being ions/cm$^3$. The log of the normalized signal intensity is shown on the y axis.

These and other objects are achieved by implanting a III–V substrate with an appropriate dose of O and an additional ion selected from the group consisting of Al, Cr, In, and mixtures thereof.

DESCRIPTION OF THE PREFERRED EMBODIMENTS (Al,Cr,In) and O are typically implanted at a combined dose of about 1 to about $20 \times 10^{14}$ ions/cm$^2$. O alone must be implanted at doses of 1 to $2 \times 10^{15}$ ions/cm$^2$. At lower doses, insufficient protection against SEU may result. Implantation at higher doses results in diminishing returns and lower practicality. Typically, the layer is buried about 1 $\mu$m beneath the implanted surface. If the implant is too far beneath the surface, then no significant protection against SEU results, since the volume between the active region and the implanted layer will be too great. If the implant is too close to the surface, the surface characteristics of the workpiece will be significantly altered, complicating the processability of the workpiece. Typically, the most useful implant depths are obtained by implantation at energies of about 1 to about 5 MeV.

The implanted layer typically has a total thickness of about 0.5 $\mu$m to about 1.5 $\mu$m. If the layer is too thin, then no significant protection against SEU results. If the layer is thicker than optimum, the resulting product will be increased in cost without a further improvement in SEU protection.

As with LTGaAs, the degree to which SEU events are suppressed is correlated with the product of the layer thickness and the lifetime in the layer. If the lifetime is shorter, a thinner layer can be used and, if longer, a thicker layer is required. The different lifetimes and the layer thickness can be easily controlled by varying process parameters such as implant concentration, implantation energy, and annealing temperature. To utilize the oxygen or oxygen and aluminum doping approach doped layers on the order of one micron will suffice for the following cases: 1) oxygen implanted to a concentration of $1\times10^{20}/cm^3$ and subsequently annealed for 30 minutes at any temperature between 600 and 800 degrees C; 2) a co-implant of oxygen to a dose of $1\times10^{19}/cm^3$ and Al to a dose of $5\times10^{18}/cm^3$, and subsequently annealed for 30 minutes at any temperature between 600 and 800 degrees C. The implanted layer could be contiguous with the surface, and hence appropriate for subsequent epitaxial growth of the device active layers (the anneal of the implant could be done during the epitaxial growth process or before) or high-energy implantation can be used to bury the layer doped with oxygen or oxygen and aluminum, leaving the near surface region compatible with the use of low-energy implantation for the device fabrication.

As an example, Table 1 and Table 2 show the energy and ion beam densities required to achieve a desirable peak implant densities of O (Table 1) and Al (Table 2) in a semi-insulating GaAs substrate with a resistivity of $2\times10^7$ to $4\times10^7$ ohm·cm and mobility of 6900 to 7400 $cm^2/Vs$.

TABLE 1

Combination of implant ion density and energy for densited implant densities of $O_{16}$

| Implant ion energy | Ion Density for $1 \times 10^{18}$ cm$^{-3}$ peak implant density | Ion Density for $1 \times 10^{19}$ cm$^{-3}$ peak implant density | Ion density for $1 \times 10^{20}$ cm$^{-3}$ peak implant density |
|---|---|---|---|
| 606 KeV | $6 \times 10^{13}$ cm$^{-2}$ | $6 \times 10^{14}$ cm$^{-2}$ | $6 \times 10^{15}$ cm$^{-2}$ |
| 300 KeV | $4 \times 10^{13}$ cm$^{-2}$ | $4 \times 10^{14}$ cm$^{-2}$ | $4 \times 10^{15}$ cm$^{-2}$ |
| 100 KeV | $2 \times 10^{13}$ cm$^{-2}$ | $2 \times 10^{14}$ cm$^{-2}$ | $2 \times 10^{15}$ cm$^{-2}$ |

TABLE 2

Combination of implant ion density and energy for desited implant densities of Al

| Implant ion energy | Ion Density for $1 \times 10^{18}$ cm$^{-3}$ peak implant density | Ion Density for $1 \times 10^{19}$ cm$^{-3}$ peak implant density | Ion density for $1 \times 10^{20}$ cm$^{-3}$ peak implant density |
|---|---|---|---|
| 1 MeV | $6 \times 10^{13}$ cm$^{-2}$ | $3 \times 10^{14}$ cm$^{-2}$ | $12 \times 10^{14}$ cm$^{-2}$ |
| 500 MeV | $4 \times 10^{13}$ cm$^{-2}$ | $2 \times 10^{14}$ cm$^{-2}$ | $8 \times 10^{14}$ cm$^{-2}$ |
| 170 KeV | $2 \times 10^{13}$ cm$^{-2}$ | $1 \times 10^{14}$ cm$^{-2}$ | $4 \times 10^{14}$ cm$^{-2}$ |
| 80 KeV | $1 \times 10^{13}$ cm$^{-2}$ | $0.5 \times 10^{14}$ cm$^{-2}$ | $2 \times 10^{14}$ cm$^{-2}$ |

The ratio between Al and O can be widely varied. Although the entire dose can be O, implanting a mixture of O and at least one additional ion selected from the group consisting of Al, Cr, In, and mixtures thereof significantly reduces cost. Typically, to obtain a cost benefit from implanting the at least one additional ion along with O, the total dose of additional ions should be at least about 50 at. % of the implanted dose of O. Generally, the total dose of additional ions implanted is no more than about 150 at. % of the implanted dose of O.

The implantation of O and the at least one additional ion may be performed at any practical substrate temperature. To minimize the cost of implanting, the implant is typically performed on a room temperature substrate.

The at least one additional ion and O can be implanted either simultaneously (co-implant), or sequentially. If the implantation is performed sequentially, either the O or the at least one additional ion may be implanted first. Also, if more than one additional ion is implanted, the additional ions may be implanted simultaneous with each other and/or the implantation of O, or may be implanted sequential with respect to each other and the implantation of O.

Annealing is not required with the present invention provided the workpiece reaches a temperature of at least 600° C. in the course of subsequent processing. Where desirable, the implanted workpiece may be annealed at any temperature typically used for annealing ion implanted semiconductor substrates. Typically, the annealing temperature is about 600° C. to just below the melting temperature of the implanted workpiece. Usually, annealing is performed at about 600° C. to about 830° C.

Having described the invention, the following examples are given to illustrate specific applications of the invention including the best mode now known to perform the invention. These specific examples are not intended to limit the scope of the invention described in this application.

EXAMPLES

Example 1

Figure 1B:
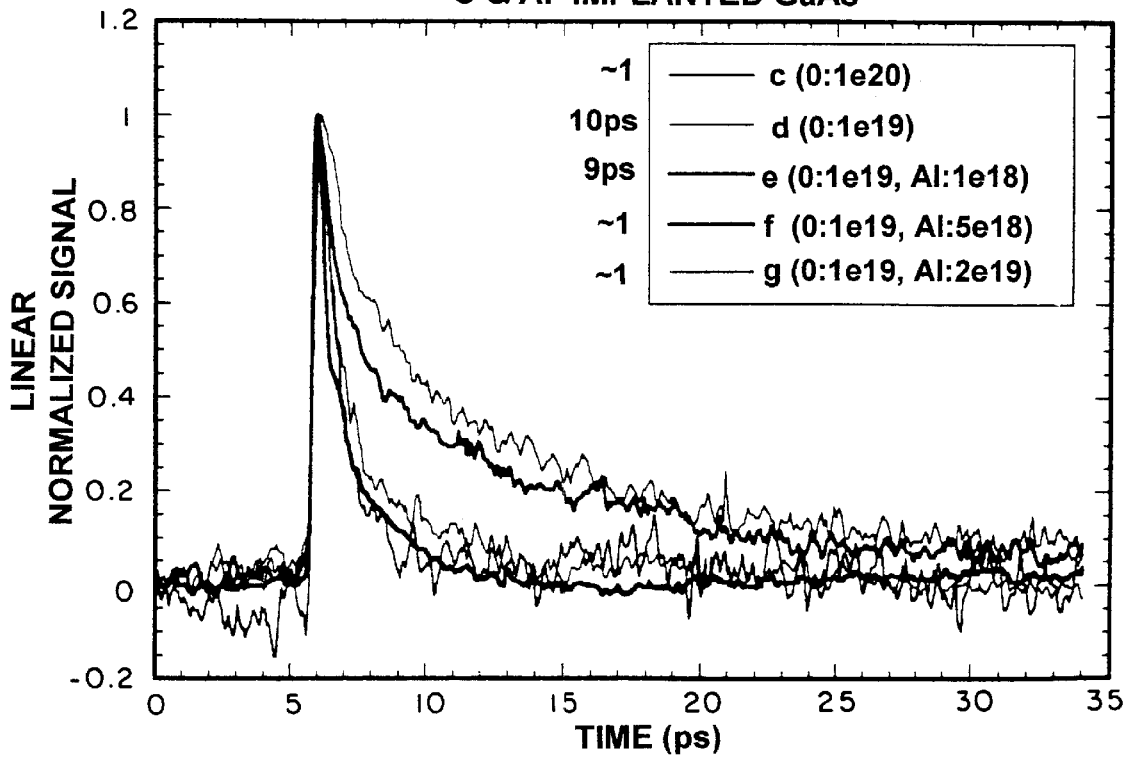
FIG. 1b is a graph showing free carrier lifetime in materials of Example 1, as a function of various implant conditions, with the dosage units being ions/cm$^3$. The normalized signal intensity is shown on the y axis.

To evaluate the potential of this concept a matrix of oxygen and aluminum implants was done into semi-insulating GaAs and subsequently annealed at 800° centigrade. The lifetime was then measured as a function of the implant parameters and it was established that lifetimes on the order of a picosecond could be attained with this approach. This is taken as proof of principle, for this approach to the SEU problem in digital GaAs circuits; and by implication this approach should be useful for the reduction of subthreshold leakage. The lifetime data is shown in FIG. 1a and FIG. 1b.

Example 2

Figure 2:
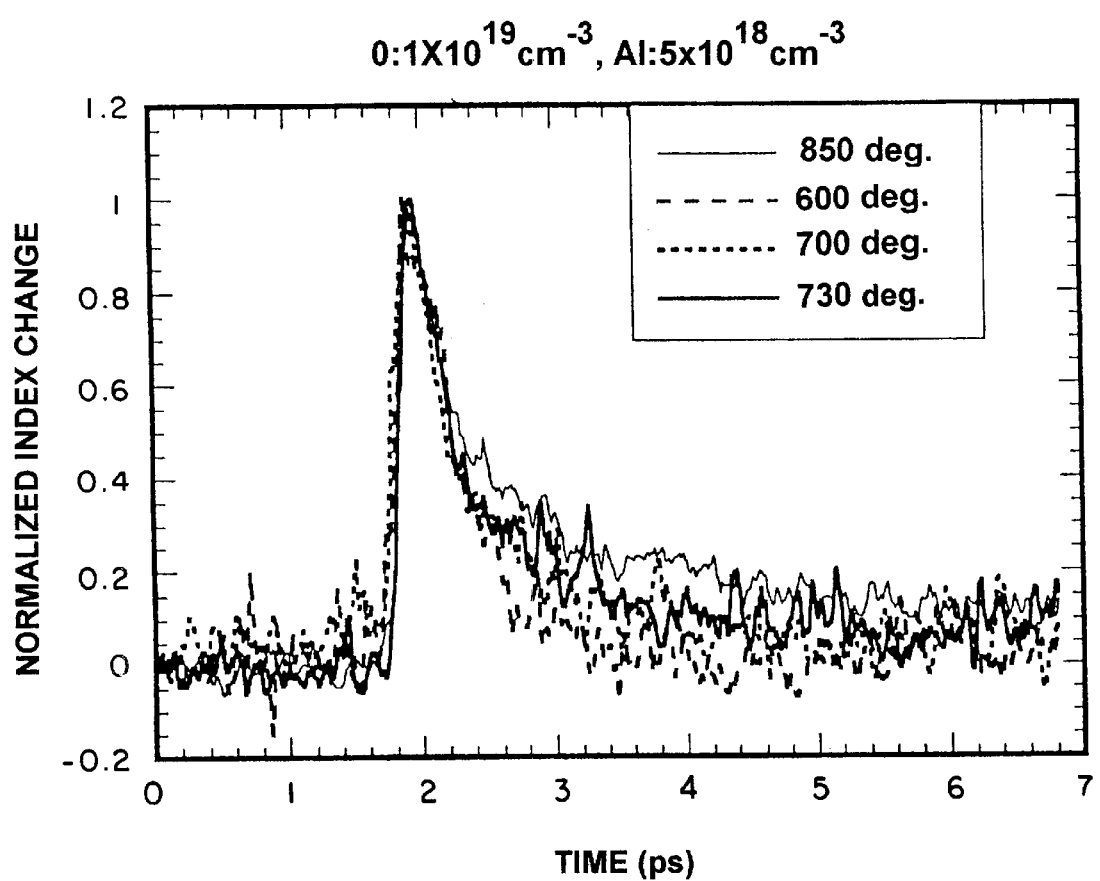
FIG. 2 is a graph showing free carrier lifetimes, in materials of Example 2, annealed at the temperatures stated in the key included therewith.

The exposed surface of a standard commercially available semi-insulating GaAs substrate with resistivity of $2\times10^7$ to $4\times10^7$ ohm·cm and mobility of 6900 to 7400 cm$^2$ was implanted with O and Al ions (O:$1\times10^{19}$ ions/cm$^3$:$5\times10^{18}$ ions/cm$^3$) sufficiently to achieve an approximately 1 micron thick implanted layer. FIG. 2 shows the experimental result showing the time-resolved photoreflectance measurements of the Al—O implanted with various isochronal annealing temperatures. The vertical scale is proportional to the free carrier density in the material during and after an ~100 fs laser pulse excitation. Following the laser pulse, the photogenerated free carriers are observed to be trapped on a short timescale.

Obviously, many modifications and variations of the present invention are possible in light of the above teachings. It is therefore to be understood that, within the scope of the appended claims, the invention may be practiced otherwise than as specifically described.

What is claimed is:

1. A gallium arsenide substrate implanted with O ions or a mixture of ions including O and at least one additional ion selected from the group consisting of Al, Cr, In, and mixtures thereof, wherein the total implanted dose of said mixture of ions is about $1 \times 10^{14}/cm^2$ to about $20 \times 10^{14}/cm^2$, and wherein said at least one additional ion is implanted at an amount of about 10 at % to about 150 at % of O ions implanted.

2. The gallium arsenide substrate of claim 1, wherein said ions are implanted at an energy of about 1 to about 5 MeV.

3. The gallium arsenide substrate of claim 1, wherein said implanted ions form an implanted layer, said implanted layer having a thickness of about 0.5 µm to about 1.5 µm.

4. A gallium arsenide substrate according to claim 1 which after implantation with said ions, has been maintained at about 600° C. to about 830° C. for a time sufficient to anneal said implanted gallium arsenide substrate.

5. The gallium arsenide substrate according to claim 1, wherein said at least one additional ion is Al.

6. The gallium arsenide substrate according to claim 1, wherein said at least one additional ion is implanted at an amount of at least about 50 at % of O ions implanted.

* * * * *